(12) United States Patent
Kim et al.

(10) Patent No.: US 7,697,327 B2
(45) Date of Patent: *Apr. 13, 2010

(54) NAND FLASH MEMORY DEVICE AND PROGRAMMING METHOD

(75) Inventors: Moo-Sung Kim, Yongin-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

This patent is subject to a terminal disclaimer.

(21) Appl. No.: 12/145,531

(22) Filed: Jun. 25, 2008

(65) Prior Publication Data

US 2008/0253182 A1 Oct. 16, 2008

Related U.S. Application Data

(63) Continuation of application No. 11/500,410, filed on Aug. 8, 2006, now Pat. No. 7,403,422.

(30) Foreign Application Priority Data

Sep. 23, 2005 (KR) ........................ 10-2005-0088848

(51) Int. Cl.
    *G11C 16/00* (2006.01)
(52) U.S. Cl. ............................ 365/185.03; 365/185.17; 365/185.19; 365/185.23
(58) Field of Classification Search ........................ None
    See application file for complete search history.

(56) References Cited

U.S. PATENT DOCUMENTS

| 5,682,346 | A | 10/1997 | Yamamura et al. |
| 6,327,183 | B1 | 12/2001 | Pawletko et al. |
| 6,643,188 | B2 | 11/2003 | Tanaka et al. |
| 6,768,676 | B2 | 7/2004 | Hirano |
| 6,850,435 | B2 | 2/2005 | Tanaka |
| 7,038,949 | B2 | 5/2006 | Chae et al. |
| 7,110,292 | B2 | 9/2006 | Hahn et al. |
| 7,116,581 | B2 * | 10/2006 | Suzuki et al. ........ 365/185.19 |
| 7,158,418 | B2 | 1/2007 | Chae et al. |
| 7,170,780 | B2 * | 1/2007 | Kawai ................ 365/185.03 |
| 7,327,608 | B2 * | 2/2008 | Lee et al. ............. 365/185.19 |
| 2006/0274564 | A1 | 12/2006 | Kim |

FOREIGN PATENT DOCUMENTS

| JP | 62204496 | 9/1987 |
| JP | 11031391 | 2/1999 |

(Continued)

*Primary Examiner*—Tan T. Nguyen
(74) *Attorney, Agent, or Firm*—Volentine & Whitt, PLLC (57) ABSTRACT

A NAND flash memory device and a programming method thereof capable of improving a program speed during a multi-level cell programming operation are provided. The device performs a programming operation using an ISPP method. Additionally, the device includes a memory cell storing multi-bit data; a program voltage generating circuit generating a program voltage to be supplied to the memory cell; and a program voltage controller controlling a start level of the program voltage. The device supplies an LSB start voltage to a selected word line during an LSB program, and an MSB start voltage higher than the LSB start voltage to the selected word line during an MSB program.

13 Claims, 6 Drawing Sheets

FOREIGN PATENT DOCUMENTS

| | | |
|---|---|---|
| JP | 11110977 | 4/1999 |
| JP | 2003051193 | 2/2003 |
| JP | 2003196988 | 7/2003 |
| JP | 2004118940 | 4/2004 |
| KR | 1020020039744 A | 5/2002 |
| KR | 1020030057259 A | 7/2003 |
| KR | 1020040027407 A | 4/2004 |
| KR | 1020050068554 A | 7/2005 |
| KR | 1020050087264 A | 8/2005 |
| KR | 1020060075161 A | 7/2006 |

* cited by examiner

NAND FLASH MEMORY DEVICE AND PROGRAMMING METHOD

CROSS-REFERENCE TO RELATED APPLICATION

This application is a continuation of U.S. patent application Ser. No. 11/500,410, filed on Aug. 8, 2006, now U.S. Pat. No. 7,403,422 which claims priority to Korean patent application number 10-2005-0088848, filed Sep. 23, 2005. The subject matter of both of these applications is hereby incorporated by reference.

BACKGROUND OF THE INVENTION

1. Field of the Invention

Embodiments of the invention relate to semiconductor memory devices. More particularly, embodiments of the invention relate to NAND flash memory devices and programming methods having improved speed during a multi-level cell programming operation.

2. Description of the Related Art

Various semiconductor memory devices have been developed to store and subsequently provide data. Semiconductor memory devices may be classified into random access memory (RAM) and read only memory (ROM). The RAM is a volatile memory device in which stored data disappears when power is turned off. The ROM is nonvolatile memory device in which stored data is retained even if power is turned off. The RAM includes dynamic RAM (DRAM), static RAM (SRAM), etc. The ROM includes programmable ROM (PROM), erasable PROM (EPROM), electrically EPROM (EEPROM), flash memory, etc. Flash memory devices may be further classified as NAND flash memory devices and NOR flash memory devices.

NAND flash memory devices store multi-bit data on a single memory cell. A memory cell adapted to store multi-bit data is referred to as a multi-level cell (MLC). MLCs have multiple programmable states. For example, an MLC storing 2-bit data will have four (4) programming states that vary by threshold voltage and correspond one for one to data values '11', '10', '00' and '01'. Within this context, the programming states and the corresponding data values include a least significant bit (LSB) of data and a most significant bit (MSB) of data.

Conventional NAND flash memory devices often use an incremental step pulse program (ISPP) method that is well adapted for use with a range of threshold voltages defining multiple programming states for an MLC. In the ISPP method, a final program voltage is not applied to a selected word line all at once during a programming operation, but is applied to the selected word line incrementally according to a defined programming routine.

A method for programming multi-bit data on an MLC is referred to as an MLC programming method. A 2-bit MLC programming method, for example, may be divided into an LSB programming operation adapted to program the LSB data, and an MSB programming operation adapted to program the MSB data. During the LSB programming operation, a corresponding LSB program voltage is applied to a selected word line, and a corresponding MSB program voltage is applied to a selected word line during the MSB programming operation.

A NAND flash memory device that performs an MLC programming operation using the conventional ISPP approach, typically uses an identical start voltage during the LSB programming operation and the MSB programming operation. That is, the conventional NAND flash memory device used an LSB start voltage and an MSB start voltage having similar levels. The LSB start voltage is a program voltage initially applied during an LSB programming operation, and the MSB start voltage is a program voltage initially applied during an MSB programming operation.

When the LSB programming operation is performed, the memory cell has a '11' state or a '10' state. AN MLC in a '10' state has a threshold voltage higher than that of an MLC in a '11' state. Thus, when an MSB programming operation is performed, an MLC cell in a '11' state will transition to a '01' state, while an MLC in a '10' state will transition to a '00' state.

Since the threshold voltage applied to an MLC increases through the LSB programming operation of the conventional programming methods, the fact that similar LSB and MSB start voltages are used becomes a significant consideration in any attempt to improve programming operation speed.

SUMMARY OF THE INVENTION

Embodiments of the invention provide a NAND flash memory device and programming method capable of improving a program speed during a multi-level cell programming operation. Embodiments of the invention also provide a NAND flash memory device adapted to perform a programming operation using an ISPP method having improved programming operation speed.

Thus, in one embodiment, the invention provides a NAND flash memory device performing a programming operation using an incremental step pulse program (ISSP) method, the device comprising; a memory cell adapted to store multi-bit data in response to a program voltage, a program voltage generating circuit adapted to generate the program voltage, and a program voltage controller adapted to control a start level of the program voltage.

In another embodiment, the invention provides an ISPP programming method for a NAND flash memory device storing multi-bit data in a memory cell, the method comprising; supplying a least significant bit (LSB) start voltage to a selected word line during an LSB program operation, and supplying a most significant bit (MSB) start voltage higher than the LSB start voltage to the selected word line during an MSB program operation.

DESCRIPTION OF EXEMPLARY EMBODIMENTS

Reference will now be made to embodiments of the present invention illustrated in the accompanying drawings. However, the present invention is not limited to only the illustrated embodiments. Rather, the embodiments are presented as teaching examples.

Figure 1:
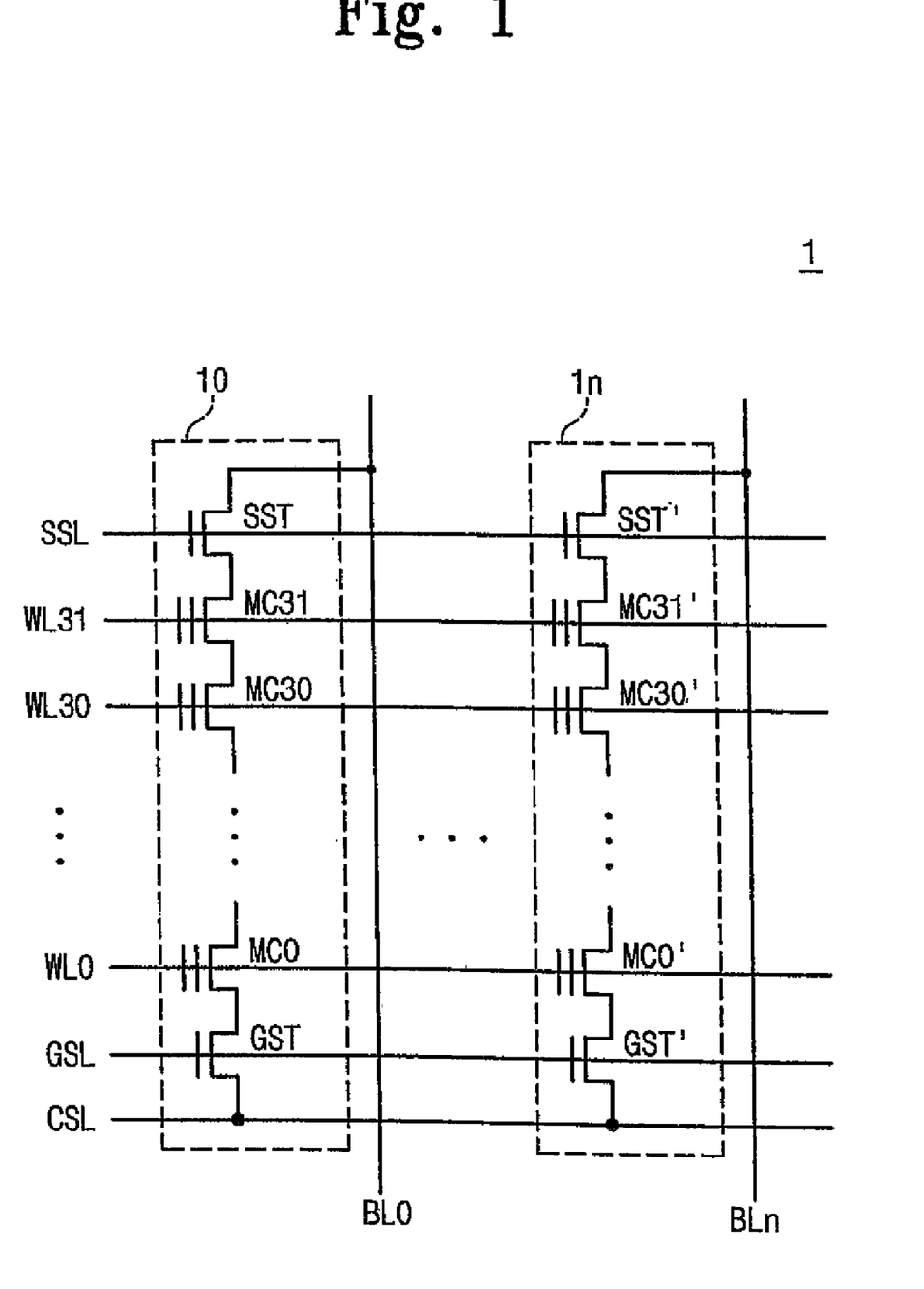
FIG. 1 is a circuit diagram illustrating a memory cell array of a NAND flash memory device.

FIG. 1 is a circuit diagram partially illustrating an exemplary memory cell array of a NAND flash memory device. Referring to FIG. 1, a memory cell array 1 includes a plurality of cell strings 10 to 1n. Each of the cell strings 10 to 1n has an identical configuration and is connected between bit lines BL0 to BLn and a common source line.

Cell string 10 is connected to bit line BL0. A ground selection transistor GST, a plurality of memory cells MC0 to MC31, and a string selection transistor SST are serially connected along cell string 10. The ground selection transistor GST is connected to the common source line CSL, and the string selection transistor SST is connected to the bit line BL0. The plurality of memory cells MC0 to MC31 are connected between the ground selection transistor GST and the string selection transistor SST. The number of memory cells may vary by design (e.g., 16, 32, 64, etc.).

The gates of the plurality of cells MC0 to MC31 are respectively connected to a plurality of word lines WL0 to WL31, the gate of the string selection transistor SST is connected to a string selection line SSL, and the gate of the ground selection transistor GST is connected to a ground selection line GSL. During a programming operation, a program voltage Vpgm (for example, about 18 V) is applied to a selected word line, and a pass voltage Vpass (for example, about 8V) is applied to a non-selected word line.

Figure 2:
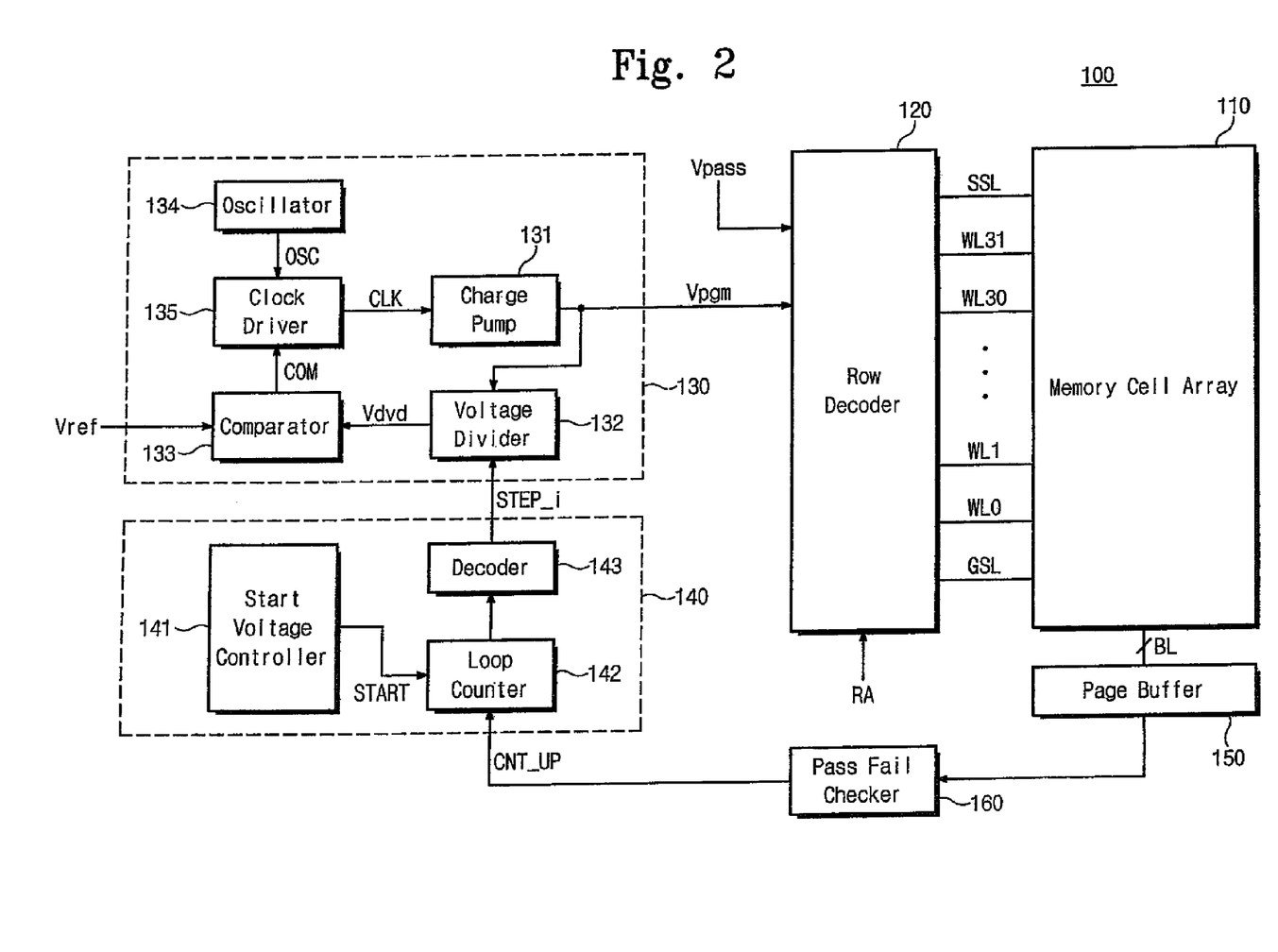
FIG. 2 is a diagram illustrating a programming method of a NAND flash memory device storing multi-bit data on one memory cell.

FIG. 2 is a diagram illustrating an exemplary programming method for a NAND flash memory device storing multi-bit data on an MLC. Referring to FIG. 2, a NAND flash memory device 100 includes a cell array 110, a row decoder 120, a program voltage generating circuit 130, a program voltage controller 140, a page buffer 150, and a pass-fail checking circuit 160.

Memory cell array 110 is connected to a ground selection line GSL, a plurality of word lines WL0 to WL31, and a string selection line SSL. Memory cell array 110 is connected the page buffer 150 through the bit line BL.

Row decoder 120 supplies a program voltage Vpgm to a selected word line in response to a row address RA during the programming operation, and a pass voltage Vpass to a non-selected word line. Here, the program voltage Vpgm is supplied from program voltage generating circuit 130, and the pass voltage Vpass is supplied from a pass voltage generating circuit (not shown).

Program voltage generating circuit 130 generates the program voltage Vpgm to be supplied to the selected word line during the programming operation. Here, the program voltage Vpgm is an incremental step voltage that increases with a predetermined voltage difference from a start voltage. The program voltage Vpgm is supplied during the LSB programming operation and the MSB programming operation. During the LSB programming operation, the LSB program voltage increases incrementally with a predetermined voltage from the LSB start voltage.

Referring to FIG. 2, an exemplary program voltage generating circuit 130 comprises a charge pump 131, a voltage distribution circuit 132, a comparator 133, an oscillator 134, and a clock driver 135. Program voltage generating circuit 130 increases the program voltage sequentially in response to a step signal STEP_i supplied from program voltage controller 140.

Charge pump 131 generates a program voltage Vpgm in response to a clock signal CLK. Voltage distribution circuit 132 distributes the program voltage Vpgm and then outputs the distributed voltage Vdvd. Voltage distribution circuit 132 increases incrementally the program voltage Vpgm in response to the sequentially enabling step signals (STEP_i; i=0 to 15). Voltage distribution circuit 132 will be described in more detail with reference to FIG. 4.

Comparator 133 receives a distribution voltage Vdvd from the voltage distribution circuit and a reference voltage Vref from a reference voltage generator (not shown). Comparator 133 compares the distribution voltage Vdvd with the reference voltage Vref, and generates a comparison signal COM. Comparator 133 generates the comparison signal COM when the distribution voltage Vdvd is lower than the reference voltage Vref.

Oscillator 134 generates an oscillation signal OSC. Clock driver 135 generates a clock signal CLK in response to the comparison signal COM and the oscillation signal OSC. Clock driver 135 will be described in more detail with reference to FIG. 5.

When the program voltage Vpgm is lower than the desired voltage, clock driver 135 generates a clock signal CLK. At this point, charge pump 131 operates in response to the clock signal CLK. When the program voltage reaches the desired voltage, clock driver 135 does not generate the clock signal CLK. At this point, the charge pump does not operate. Through this process, program voltage generating circuit 130 generates a desired program voltage Vpgm.

Referring still to FIG. 2, an exemplary program voltage controller 140 comprises a start voltage controller 141, a loop counter 142, and a decoder 143. Program voltage controller 140 controls a start level of the program voltage, that is, the LSB start voltage and the MSB start voltage.

Start voltage controller 141 stores information associated with a start level of the program voltage, and generates a start signal START according to the start level information during the programming operation. An exemplary configuration and operation for start voltage controller 141 will be described in more detail with reference to FIGS. 5 and 6.

Loop counter 142 determines a start counter value in response to a start signal START supplied from start voltage controller 141. Additionally, loop counter 142 sequentially increases a bit count value "n" (e.g., where n=4) in response to a count up signal CNT_UP applied from pass-fail checking circuit 160.

Decoder 143 generates a step signal (STEP_i; i=0 to 15) sequentially by decoding a count value from loop counter 142. For example, when 4-bit count value supplied from loop counter 142 increases such as 0000, 0001, 0010, 1111, the step signal is sequentially activated such as STEP_0, STEP_1, STEP_2, . . . , STEP_15.

Program voltage controller 140 increases the count value sequentially by the count up signal CNT_UP supplied from pass-fail checking circuit 160. Additionally, program voltage controller 140 determines a start count value. Since program voltage controller 140 can control the start count value, the LSB start voltage and the MSB start voltage may be differently defined.

Referring still to FIG. 2, pass-fail checking circuit 160 checks whether the memory cell reaches the desired level or not each time the program loop repeats. This operation is called a program verify operation. When the memory cell has a desired threshold voltage, the programming operation is terminated. However, when the memory cell does not reach a desired threshold voltage, pass-fail checking circuit 160 generates a count up signal CNT_UP. At this point, the program voltage applied to the word line increases incrementally, and the programming operation and the program verify operation are performed again.

Figure 3:
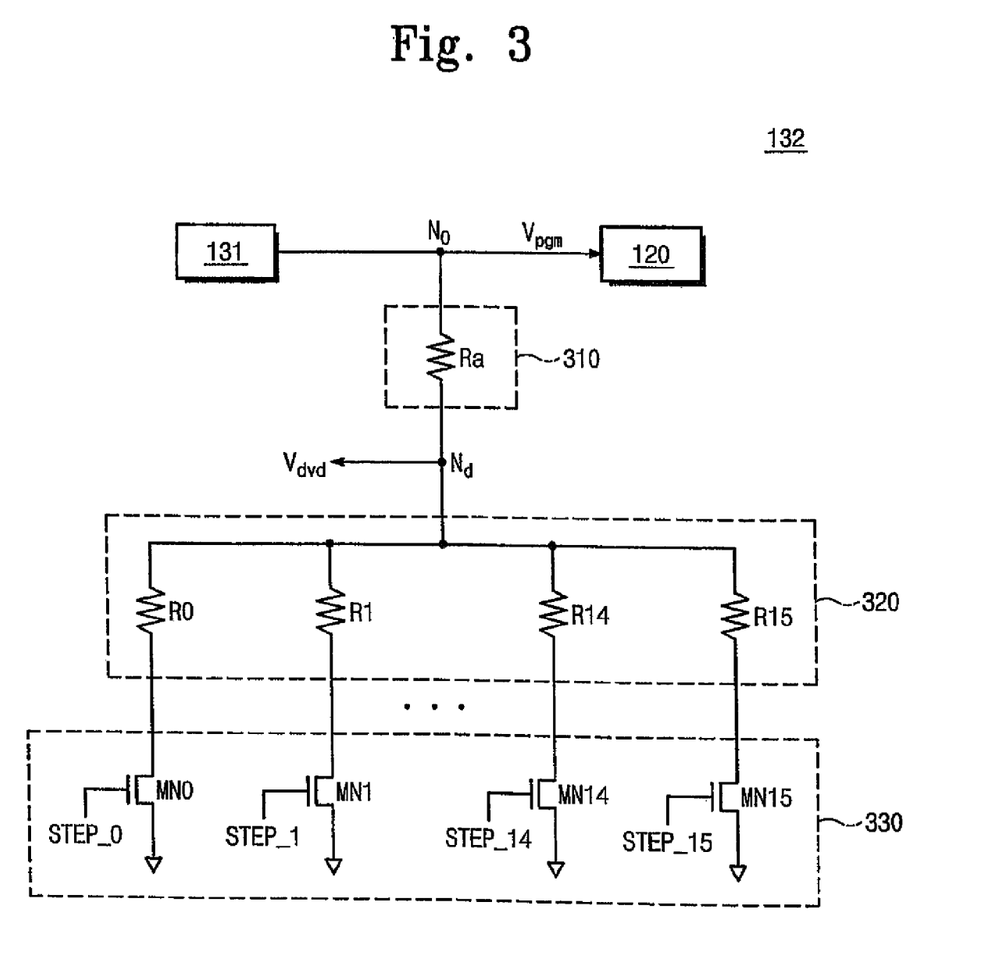
FIG. 3 is a circuit diagram of a voltage distribution circuit illustrated in FIG. 2.

FIG. 3 is a circuit diagram illustrating the voltage distribution circuit of FIG. 2 in some additional detail. Referring to FIG. 3, an exemplary voltage distribution circuit 132 comprises a first resistor circuit 310, a second resistance circuit 320, and a switch circuit 330.

First resistance circuit 310 is connected between an output node No and a distribution node Nd. First resistance circuit 310 may include one resistor Ra as illustrated in FIG. 3. Second resistance circuit 320 includes a plurality of resistors R0 through R5 connected in parallel between distribution node Nd and a switch circuit 330. Switch circuit 330 includes a plurality of switches connected between the plurality of resistors R0 through R15 and ground.

Referring to FIG. 3, the plurality of switches includes a plurality of NMOS transistors MN0 through MN15. The plurality of NMOS transistors MN0 to MN15 are turned ON/OFF in response to a step signal (STEP_i; I=0 to 15). According as the step signal is sequentially turned ON, the program voltage increases incrementally.

Figure 4:
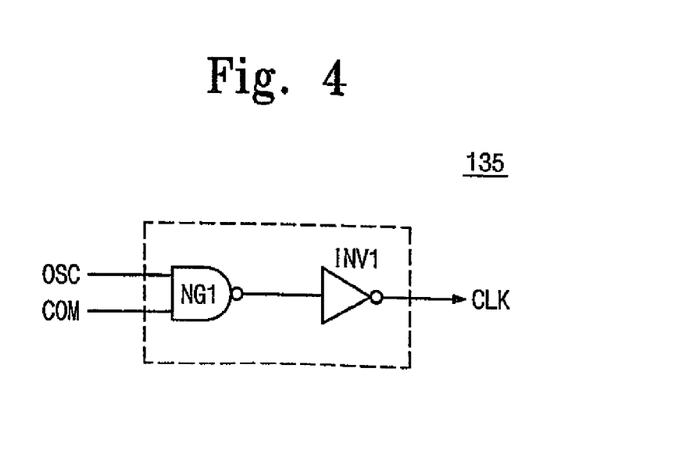
FIG. 4 is a circuit diagram of a clock driver illustrated in FIG. 2.

FIG. 4 is a circuit diagram illustrating the clock driver of FIG. 2 in some additional detail. Referring to FIG. 4, a clock driver 135 includes a NAND gate NG1 and an inverter INV1. Clock driver 135 generates an oscillation signal OSC as a clock signal CLK when the comparator signal is in a high level state. At this point, charge pump 131 is operated. Clock driver 135 does not generate the oscillation signal OSC as the clock signal CLK when the comparator signal COM is in a low level state. At this point, charge pump 131 is not operated.

Figure 5:
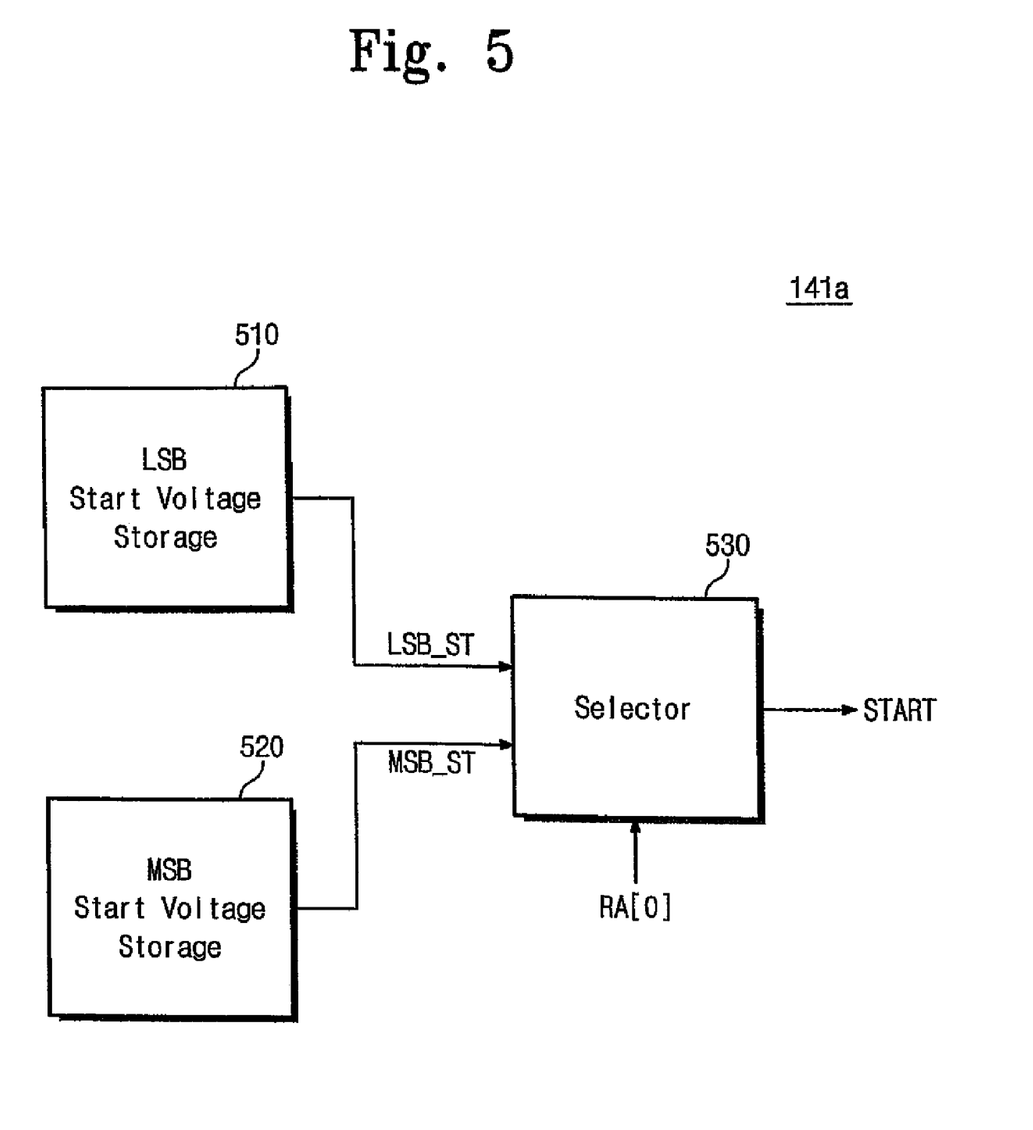
FIG. 5 is a block diagram illustrating a first embodiment of a start voltage controller illustrated in FIG. 2.

FIG. 5 is a block diagram illustrating a first exemplary embodiment of the start voltage controller of FIG. 2. Referring to FIG. 5, a start voltage controller 141a includes an LSB start voltage storage unit 510, an MSB start voltage storage unit, and a selecting circuit 530.

LSB start voltage storage device 510 stores information associated with the LSB start voltage. LSB start voltage storage unit 510 generates an LSB start signal SLB_ST to supply the LSB start voltage to a selected word line during the LSB programming operation. MSB start voltage storage unit 520 stores information associated with the MSB start signal MSB_ST. That is, selecting circuit 530 selects the LSB start signal LSB_ST or the MSB start signal MSB_ST in response to a row address RA[0]. That is, selecting circuit 530 selects the LSB start signal LSB_ST during the LSB programming operation, and the MSB start signal MSB_ST during the MSB programming operation. A signal selected by selecting circuit 530 is supplied to loop counter 142 (see, FIG. 2) as a start signal START.

A NAND flash memory device receives an externally supplied row address. The row address includes a block address selecting one among a plurality of blocks, a page address selecting one among a plurality of word lines, and an address notifying an LSB programming operation or an MSB programming operation. Here, the row address RA[0] notifies the LSB programming operation or the MSB programming operation.

Figure 6:
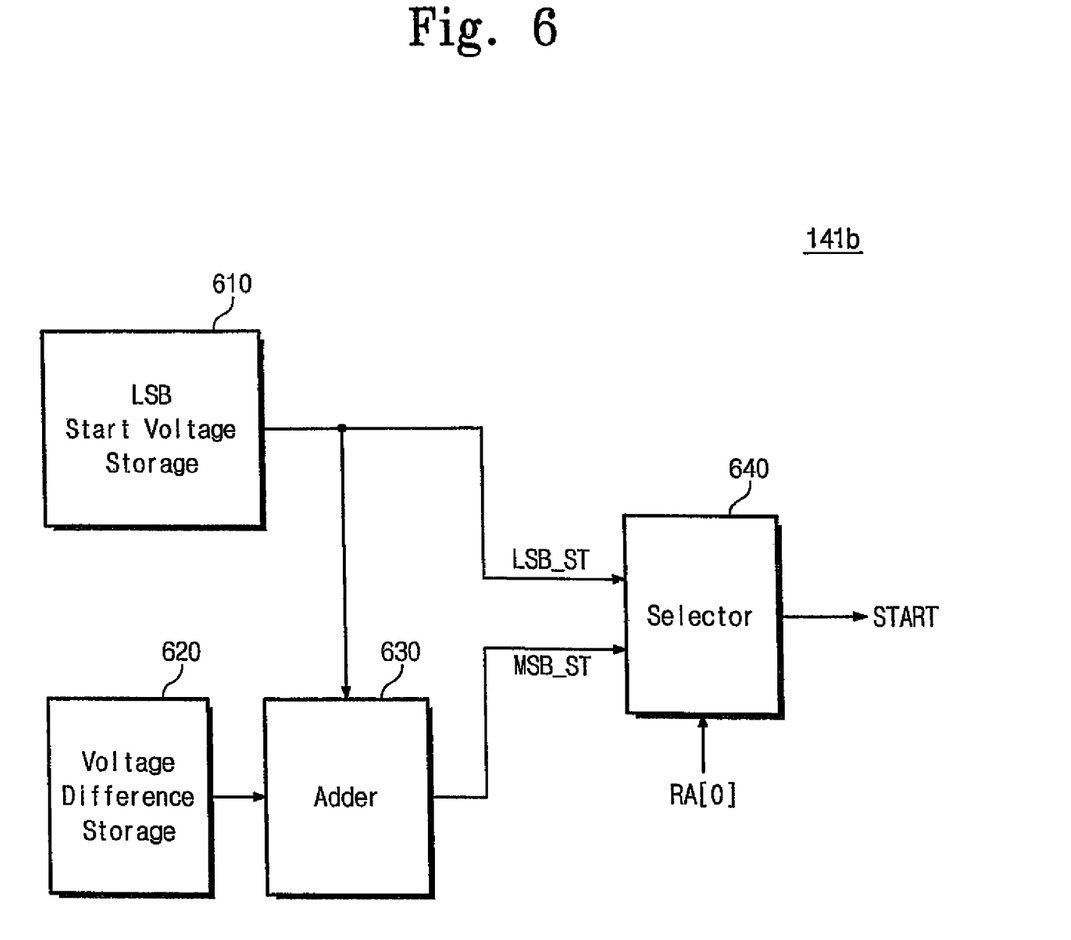
FIG. 6 is a block diagram illustrating a second embodiment of a start voltage controller illustrated in FIG. 2.

FIG. 6 is a block diagram illustrating a second exemplary embodiment of the start voltage controller of FIG. 2. Referring to FIG. 6, a start voltage controller 141b includes an LSB start voltage storage unit 610, a voltage difference storage unit 620, an adder 630, and a selecting circuit 640.

Voltage difference storage unit 620 stores information associated with a difference between the MSB start voltage and the LSB start voltage. Adder 630 generates an MSB start signal MSB_ST to supply the MSB start voltage to a selected word line by adding output signals of LSB start voltage storage unit 610 and voltage difference storage unit 620. Selecting circuit 640 selects the LSB start signal LSB_ST or the MSB start signal MSB_ST in response to the row address RA[0], and then supplies the selected signal to loop counter 142 (see, FIG. 2) as a start signal.

Figure 7:
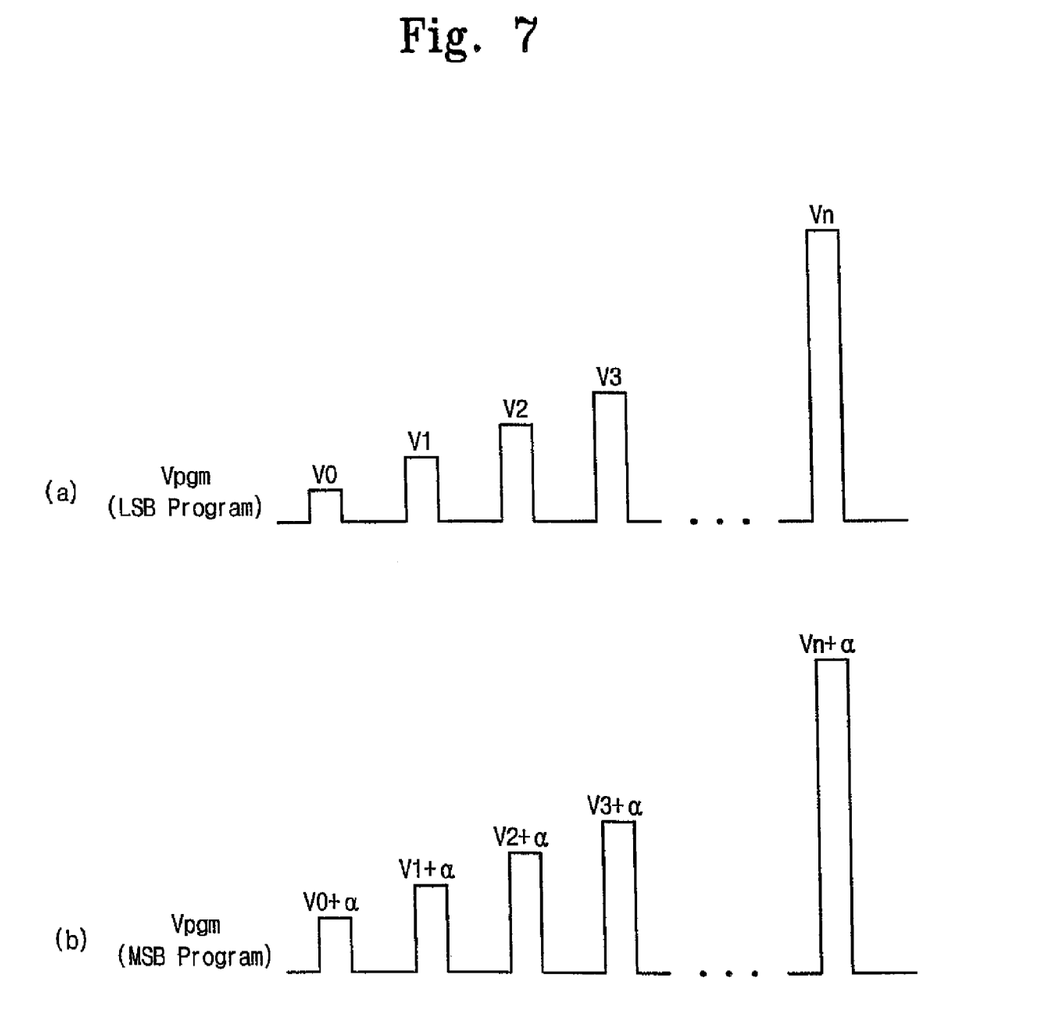
FIG. 7 is a waveform diagram of a program voltage Vpgm illustrated in FIG. 2.

FIG. 7 is a waveform diagram of a program voltage Vpgm illustrated that may be developed by the exemplary circuit shown in FIG. 2. FIG. 7(a) illustrates a program voltage Vpgm generated during an LSB programming operation. FIG. 7(b) illustrates a program voltage Vpgm generated during an MSB programming operation. Referring to FIG. 7, it can be seen that the MSB start voltage V0+α is higher than the LSB start voltage V0. When the MSB start voltage is higher than the LSB start voltage, the memory cell can reach a desired threshold voltage much faster during the MSB programming operation. However, an over programmed memory cell can be generated when the MSB start voltage is too high. Thus, the MSB start voltage can not be higher than a predetermined voltage. It is desirable that a difference between the LSB start voltage and the MSB start voltage is identical to a difference between the LSB verify voltage and MSB verify voltage.

In this manner, the exemplary NAND flash memory device may control a program start voltage according to a row address. Additionally, the NAND flash memory device may change the LSB start voltage during the LSB programming operation and the MSB start voltage during the MSB programming operation. That is, the MSB start voltage may be higher than the LSB start voltage in the NAND flash memory device. According to embodiments of the invention, the overall program operation speed may be improved because an MSB program speed becomes faster.

In a NAND flash memory device and a programming method consistent with the foregoing, since the start level of a program voltage may be changed during a programming operation, a program operation speed may be improved. Especially, the program operation speed becomes faster because the MSB start voltage may be higher than the LSB start voltage in the NAND flash memory device that performs a programming operation using an ISPP method.

It will be apparent to those skilled in the art that various modifications and variations may be made to the foregoing examples. Thus, it is intended that the scope of the invention cover such modifications and variations as defined by the appended claims and their equivalents.

What is claimed is:

1. A NAND flash memory device performing a programming operation using an incremental step pulse program (ISPP) method, the device comprising:
    a memory cell configured to store multi-bit data including at least a least significant bit (LSB) and a most significant bit (MSB) in response to a program voltage applied during a program operation;
    a program voltage generating circuit configured to generate the program voltage in response to a step signal; and
    a program voltage controller configured to generate the step signal in response to a start level, wherein the start level varies between a LSB programming operation programming the LSB in the memory cell and a MSB programming operation programming the MSB in the memory cell.

2. The device of claim 1, further comprising a pass/fail checker generating a count-up signal in response to a program verify operation performed on the memory cell,
    wherein the program voltage controller comprises;
        a start voltage controller configured to store start level information defining the start level, and generate a start signal in accordance with the start level;

a loop counter configured to determine a count value in response to the start signal and the count-up signal, and a decoder configured to generate the step signal in response to the count value.

3. The device of claim 2, wherein the start level information defines a first start level for the LSB programming operation and a second start level different from the first start level for the MSB programming operation.

4. The device of claim 3, wherein the start voltage controller further comprises:

a LSB start voltage storage unit configured to store start level information defining the first start level;

a MSB start voltage storage unit configured to store start information defining the second start level; and a selecting circuit configured to select between the LSB start voltage storage unit and the MSB start voltage storage unit in response to a row address.

5. The device of claim 4, wherein a row address indicates the LSB programming operation or the MSB programming operation.

6. The device of claim 3, wherein the second start level is different from the first start level such that generation of the program voltage during the MSB programming operation begins at a higher voltage level than generation of the program voltage during the LSB programming operation.

7. The device of claim 3, wherein the start voltage controller further comprises:

a LSB start voltage storage unit configured to store start level information defining the first start level;

a voltage difference storage unit configured to store information defining a start level difference between the LSB programming operation and the MSB programming operation;

an adder configured to add the start level difference to the first start level to define a second start level; and a selecting circuit configured to select between the LSB start voltage storage unit and the adder in response to a row address.

8. The device of claim 1, wherein the program voltage generating circuit comprises:

a charge pump circuit configured to generate the program voltage in response to a clock signal provide from a clock driver;

a voltage divider configured to generate a distributed voltage in response to the step signal and a feedback signal indicative of the program voltage;

a comparator configured to generate a comparison signal based on a comparison between a reference voltage and the distributed voltage.

9. An ISPP programming method for a NAND flash memory device storing multi-bit data including a least significant bit (LSB) and a most significant bit (MSB) in a memory cell, the method comprising:

providing a step signal to define the level of a program voltage, wherein the step signal varies between a LSB programming operation programming the LSB in the memory cell and a MSB programming operation programming the MSB in the memory cell in accordance with a first start level and a second start level, respectively.

10. The method of claim 9, further comprising:

storing information associated with the first start level and the second start level.

11. The method of claim 10, further comprising:

selecting between the first start level and the second start level on the basis of a row address indicating the LSB programming operation or the MSB programming operation.

12. The method of claim 10, wherein the second start level is different from the first start level such that generation of the program voltage during the MSB programming operation begins at a higher voltage level than generation of the program voltage during the LSB programming operation.

13. The method of claim 9, wherein the step signal additionally varies in response to a count-up signal received from a pass/fail checker performing a program verify operation on the memory cell.

* * * * *